US012750982B2

(12) United States Patent
Kini et al.

(10) Patent No.: US 12,750,982 B2
(45) Date of Patent: Sep. 29, 2026

(54) SYSTEMS AND METHODS FOR SERVER LEVEL COOLING

(71) Applicant: Advanced Micro Devices, Inc., Santa Clara, CA (US)

(72) Inventors: Girish Anant Kini, Santa Clara, CA (US); Ahmed Mohamed Abou-Alfotouh, Santa Clara, CA (US); Shardul Suresh Adkar, Austin, TX (US); Ethan Cruz, Austin, TX (US); Salvador D. Jimenez, III, Austin, TX (US); Mark Steinke, Austin, TX (US); Edgar Stone, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 278 days.

(21) Appl. No.: 18/345,917

(22) Filed: Jun. 30, 2023

(65) Prior Publication Data

US 2025/0008698 A1 Jan. 2, 2025

(51) Int. Cl.
*H05K 7/20* (2006.01)

(52) U.S. Cl.
CPC ................................ *H05K 7/20772* (2013.01)

(58) Field of Classification Search
CPC ....................... H05K 7/20254; H05K 7/20772
See application file for complete search history.

(56) References Cited

U.S. PATENT DOCUMENTS

| | | | | |
|---|---|---|---|---|
| 9,717,161 | B2 * | 7/2017 | Katsumata | H05K 7/20254 |
| 12,055,986 | B2 * | 8/2024 | Macias | H05K 7/20772 |
| 12,501,538 | B2 * | 12/2025 | Ku | H05K 1/0209 |
| 2021/0208647 | A1 * | 7/2021 | Macias | G06F 1/20 |
| 2021/0321526 | A1 * | 10/2021 | Kulkarni | H05K 5/06 |
| 2023/0422389 | A1 * | 12/2023 | Subrahmanyam | H05K 1/0203 |
| 2024/0345639 | A1 * | 10/2024 | Macias | H05K 1/0272 |
| 2024/0357769 | A1 * | 10/2024 | Sun | H01L 25/0652 |
| 2025/0087557 | A1 * | 3/2025 | Nabovati | H01L 25/0655 |
| 2025/0096071 | A1 * | 3/2025 | Wu | H01L 23/4012 |
| 2025/0107045 | A1 * | 3/2025 | Kini | H01L 23/34 |
| 2025/0233088 | A1 * | 7/2025 | Jain | H01L 23/645 |
| 2025/0338387 | A1 * | 10/2025 | Kini | H05K 1/0203 |
| 2025/0393115 | A1 * | 12/2025 | Liu | H05K 1/0203 |

FOREIGN PATENT DOCUMENTS

| | | | | |
|---|---|---|---|---|
| CN | 221748644 U | * | 9/2024 | |
| TW | I901227 B | * | 10/2025 | |
| WO | WO-2023023090 A1 | * | 2/2023 | H01L 25/0655 |

* cited by examiner

*Primary Examiner* — Robert J Hoffberg
(74) *Attorney, Agent, or Firm* — Greenberg Traurig, LLP

(57) ABSTRACT

A method for server level cooling can include providing a printed circuit board and attaching a cooling system to the printed circuit board. The cooling system can be configured for placement thereon of two or more expansion cards having back side power delivery components. Various other methods, systems, and computer-readable media are also disclosed.

20 Claims, 8 Drawing Sheets

800

SYSTEMS AND METHODS FOR SERVER LEVEL COOLING

BACKGROUND

Available expansion card printed circuit board (PCB) real estate for voltage regulators, primarily on a front side of the expansion card, sets an upper limit of an amount of power that can be delivered to an integrated circuit (e.g., an accelerator) of the expansion card. Placing highly integrated voltage regulators and an associated cooling system on the back side of the accelerator card, underneath the processor, can increase the total power delivered to accelerator by at least 50%. In addition, the back side power delivery provides significantly reduced power path resistance and power delivery network (PDN) impedance between voltage regulators and the processor. These improvements increase power conversion efficiency, and hence achieve higher throughput power while reducing the PDN noise.

Efficient cooling of the power delivery components on the back side of the expansion card PCB facilitates the power architecture described above. In order to meet open compute project (OCP) accelerator module (OAM) form factor requirements, both the back side power delivery components and cooling solution should fit within an eight millimeter vertical space.

U.S. patent application Ser. No. 18/162,666, filed Jan. 31, 2023 and entitled "Systems and Methods for Cooling an Apparatus having Back side Power Delivery Components" discloses an expansion card having both top and bottom cooling systems with cooling fluid routed between the cooling systems using holes through a PCB of the expansion card. The disclosure of the aforementioned application is incorporated by reference herein in its entirety.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
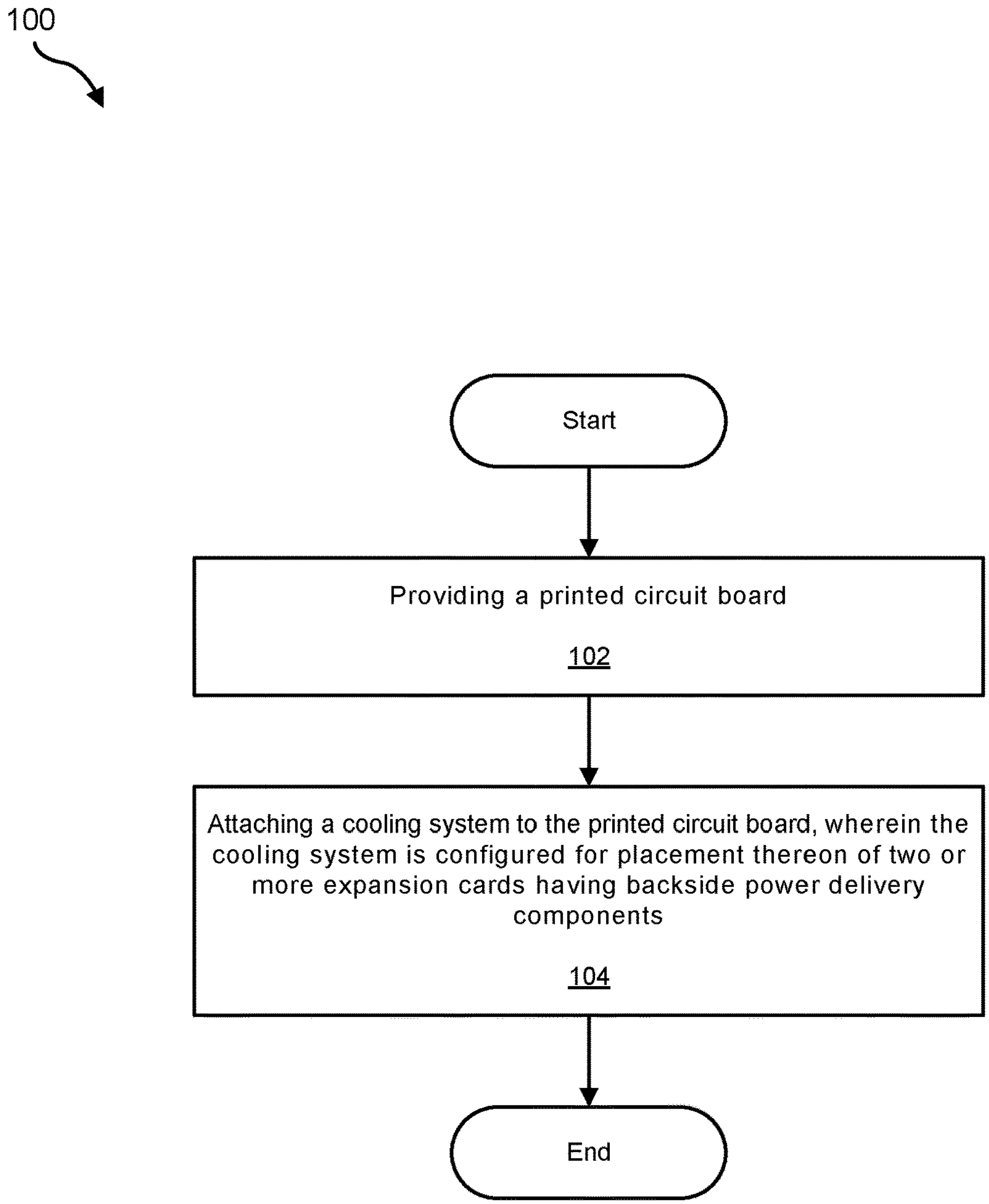
FIG. 1 is a flow diagram of an example method for system level cooling.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to systems and methods for server level cooling. For example, the disclosed systems and methods can provide a shared server level cooling mechanism that enables highly integrated power delivery components to be placed on the back side of the accelerator card, underneath the processor, and can enable increased total board power (e.g., at least fourteen hundred watts). The cooling system can be directly attached to a server's printed circuit board (PCB) (e.g., Universal Base Board (UBB)), thereby improving fluid routing and serviceability by allowing easy replacement of accelerators in service. The highly integrated nature of this cooling system can also allow for increased power density and meeting of the power delivery requirements of high-performance accelerators.

The disclosed systems and methods can achieve numerous benefits. For example, the disclosed systems and methods can enable power delivery of at least fourteen hundred watts in an OAM form factor, which represents the highest power density in the industry and corresponds to delivery of more than two-thousand five-hundred amps. In other examples, the disclosed systems and methods can also achieve a lower cost thermal solution and/or ease of assembly and serviceability in operation. In still other examples, the disclosed systems and methods can further achieve reduced PCB copper planes and numbers of layers that can yield a lower PCB cost for the expansion cards, reduced power path resistance between voltage regulators and processors, lower PCB copper losses, increased conversion efficiency, increased useful throughput power, reduced PDN impedance between voltage regulators and processors, and/or lower PDN noise.

In one example, an apparatus includes a printed circuit board and a cooling system attached to the printed circuit board, wherein the cooling system is configured for placement thereon of two or more expansion cards having back side power delivery components.

Another example can be the previously described example apparatus, further including a thermal interface material positioned on a cooling element of the cooling system.

Another example can be any of the previously described example apparatuses, wherein a cooling element of the cooling system has a thickness of no more than half of an amount of available clearance beneath a printed circuit board of the two or more expansion cards in conformance with open compute project accelerator module form factor requirements.

Another example can be any of the previously described example apparatuses, wherein a combined thickness of the cooling system, the back side power delivery components, and a thermal interface material positioned between a cooling element of the cooling system and the back side power delivery components is no greater than an amount of available clearance beneath a printed circuit board of the two or more expansion cards in conformance with open compute project accelerator module form factor requirements.

Another example can be any of the previously described example apparatuses, wherein the cooling system is operable independently of an additional cooling system located on a front side of at least one of the two or more expansion cards.

Another example can be any of the previously described example apparatuses, wherein a temperature of a fluid deliverable through a cooling element of the cooling system is controllable independently of an additional temperature of an additional fluid deliverable through an additional cooling element of the additional cooling system.

Another example can be any of the previously described example apparatuses, wherein a flow rate of a fluid deliverable through a cooling element of the cooling system is controllable independently of an additional flow rate of an additional fluid deliverable through an additional cooling element of the additional cooling system.

Another example can be any of the previously described example apparatuses, wherein the cooling system is configured to facilitate swappable replacement of the two or more expansion cards without requiring modification of the cooling system.

Another example can be any of the previously described example apparatuses, wherein a cooling element of the cooling system has at least one fluid inlet, at least one fluid outlet, and at least one fluid routing component.

Another example can be any of the previously described example apparatuses, wherein the at least one fluid routing component includes at least one of one or more cooling channels, one or more pin fins, one or more serpentine channels, or one or more heat transfer enhancement structures.

Another example can be any of the previously described example apparatuses, wherein a combined power delivery of the back side power delivery components and front side power delivery components of an individual expansion card of the two or more expansion cards is at least fourteen-hundred watts.

Another example can be any of the previously described example apparatuses, wherein the printed circuit board is configured as a universal base board to which the cooling system is directly attached.

In one example, a system includes a universal base board, a cooling system directly attached to the universal base board, and two or more expansion cards having back side power delivery components placed on a cooling element of the cooling system with a thermal interface material positioned between the cooling element and the back side power delivery components.

Another example can be the previously described example system, wherein a combined thickness of the cooling system, the back side power delivery components, and the thermal interface material is no greater than an amount of available clearance beneath a printed circuit board of the two or more expansion cards in conformance with open compute project accelerator module form factor requirements.

Another example can be any of the previously described example systems, wherein a combined power delivery of the back side power delivery components and front side power delivery components of an individual expansion card of the two or more expansion cards is at least fourteen-hundred watts.

Another example can be any of the previously described example systems, wherein the cooling system is configured to facilitate swappable replacement of the two or more expansion cards without requiring modification of the cooling system.

In one example, a method can include providing a printed circuit board and attaching a cooling system to the printed circuit board, wherein the cooling system is configured for placement thereon of two or more expansion cards having back side power delivery components.

Another example can be the previously described example method, wherein a combined thickness of the cooling system, the back side power delivery components, and a thermal interface material positioned between a cooling element of the cooling system and the back side power delivery components is no greater than an amount of available clearance beneath a printed circuit board of the two or more expansion cards in conformance with open compute project accelerator module form factor requirements.

Another example can be any of the previously described example methods, wherein a combined power delivery of the back side power delivery components and front side power delivery components of an individual expansion card of the two or more expansion cards is at least fourteen-hundred watts.

Another example can be any of the previously described example methods, wherein the cooling system is configured to facilitate swappable replacement of the two or more expansion cards without requiring modification of the cooling system.

The following will provide, with reference to FIG. 1, detailed descriptions of example methods for server level cooling. In addition, detailed descriptions of example expansion cards will be provided below in connection with FIGS. 2 and 3. Also, detailed descriptions of example apparatuses for server level cooling will be provided below in connection with FIGS. 4-7. Further, detailed descriptions of example power delivery will be provided below in connection with FIG. 8.

As illustrated in FIG. 1, step 102 can include providing a circuit board. For example, step 102 can include providing a printed circuit board.

The term "printed circuit board," as used herein, can generally refer to a medium used in electrical and electronic engineering to connect electronic components to one another in a controlled manner. For example, and without limitation, a printed circuit board (PCB) can take the form of a laminated sandwich structure of conductive and insulating layers, with each of the conductive layers being designed with an artwork pattern of traces, planes, and other features (e.g., like wires on a flat surface) etched from one or more sheet layers of copper laminated onto and/or between sheet layers of a non-conductive substrate. Electrical components can be fixed to conductive pads on the outer layers in the shape designed to accept the component's terminals, generally by means of soldering, to both electrically connect and mechanically fasten them to it. Another manufacturing process can add vias, such as plated-through holes that allow interconnections between layers. PCBs can be single-sided (e.g., one copper layer), double-sided (e.g., two copper layers on both sides of one substrate layer), or multi-layer (e.g., outer and inner layers of copper, alternating with layers of substrate). Multi-layer PCBs allow for much higher component density because circuit traces on the inner layers would otherwise take up surface space between components.

The systems described herein can perform step 102 in a variety of ways. In one example, step 102 can include providing a printed circuit board configured as a universal base board. In some of these examples, the printed circuit board can be configured as a universal base board of a server. In some examples, step 102 can include providing a prefabricated printed circuit board. Alternatively, step 102 can include fabricating the printed circuit board.

The term "universal base board," (UBB) as used herein, can generally refer to a printed circuit board conforming to UBB design specifications. For example, and without limitation, a UBB can provide modular and flexible support for open compute project (OCP) accelerator modules (OAMs) and provide design flexibility for conceivable system designs. For example, a UBB can support multiple OAM modules (e.g., four (4P) or eight (8P)), but be engineered to facilitate comprehensive options of interconnecting fabrics and topologies, power domains, thermal design powers (TDPs), cooling solutions, and scale-out options. While some UBB designs can be optimized for a few standard configurations and released OAM modules, other UBB designs can also accommodate future trends and customer needs.

As illustrated in FIG. 1, step 104 can include attaching a cooling system. For example, step 102 can include attaching a cooling system to the printed circuit board, wherein the cooling system is configured for placement thereon of two or more expansion cards having back side power delivery components.

The term "cooling system," as used herein, can generally refer to passive or active systems that are designed to regulate and dissipate the heat generated by a computer to maintain optimal performance and protect the computer from damage that will occur from overheating. For example, and without limitation, example cooling systems include one or more cold plates and/or one or more heat pipes. Cooling systems can also include thermal interface material that goes into joints to fill air gaps between solid surfaces during assembly. Thermal interface material can correspond to, be combined with, and/or include one or more heat spreaders that have high thermal conductivity and can be used as a bridge between a heat source and a heat exchanger.

The term "expansion card," as used herein, can generally refer to a printed circuit board that can be inserted into an electrical connector, or expansion slot (e.g., bus slot) on a computer's motherboard (e.g., backplane) to add functionality to a computer system. For example, and without limitation, expansion card can be an expansion board, an adapter card, a peripheral card, and/or an accessory card. Sometimes the design of the computer's case and motherboard involves placing most or all of the expansion slots onto a separate, removable card. Typically, such cards are referred to as riser cards in part because they project upward from the board and allow expansion cards to be placed above and parallel to the motherboard. Various standards define requirements for expansion cards, including power delivery requirements and form factors. One such standard corresponds to open compute project (OCP) accelerator module (OAM) for graphics accelerator cards.

The term "power delivery components," as used herein, can generally refer to an electricity regulation device. For example, and without limitation, power delivery component can refer to one or more voltage regulators. A voltage regulator is a system designed to automatically maintain a constant voltage. A voltage regulator can use a simple feed-forward design or include negative feedback. It can use an electromechanical mechanism or electronic components. Depending on the design, it can be used to regulate one or more alternating current (AC) or direct current (DC) voltages. In this context, the term "back side power delivery components" can generally refer to power delivery components located on a back side of an expansion card having an integrated circuit (e.g., processor, accelerator, etc.) located on a front side of the expansion card.

The systems described herein can perform step 104 in a variety of ways. In one example, step 104 can include directly attaching the cooling system to a PCB configured as a universal baseboard. In one example, step 104 can include positioning a thermal interface material on a cooling element of the cooling system. In another example, step 104 can include attaching a cooling system having a cooling element that has a thickness of no more than half of an amount (e.g., four millimeters) of available clearance (e.g., eight millimeters) beneath the PCB 202 in conformance with open compute project (OCP) accelerator module (OAM) form factor requirements. In some of these examples, a combined thickness of the cooling system, the back side power delivery components, and a thermal interface material positioned between a cooling element of the cooling system and the back side power delivery components is no greater than an amount of available clearance (e.g., eight millimeters) beneath the PCB 202 in conformance with OAM form factor requirements. In another example, step 104 can include attaching a cooling system that is operable independently of an additional cooling system located on a front side of at least one of the two or more expansion cards. In some of these examples, a temperature of a fluid deliverable through a cooling element of the cooling system can be controllable independently of an additional temperature of an additional fluid deliverable through an additional cooling element of the additional cooling system. Alternatively or additionally, a flow rate of a fluid deliverable through a cooling element of the cooling system can be controllable independently of an additional flow rate of an additional fluid deliverable through an additional cooling element of the additional cooling system. In another example, step 104 can include attaching a cooling system that facilitates a combined power delivery of the back side power delivery components and front side power delivery components of an individual expansion card of the two or more expansion cards being at least fourteen-hundred watts. In another example, step 104 can include attaching a cooling system configured to facilitate swappable replacement of the two or more expansion cards without requiring modification of the cooling system. In another example, step 104 can include attaching a cooling system having a cooling element of the cooling system has at least one fluid inlet, at least one fluid outlet, and at least one fluid routing component. In some of these examples, the at least one fluid routing component can include one or more cooling channels, one or more pin fins, one or more serpentine channels, and/or one or more heat transfer enhancement structures.

Figure 2:
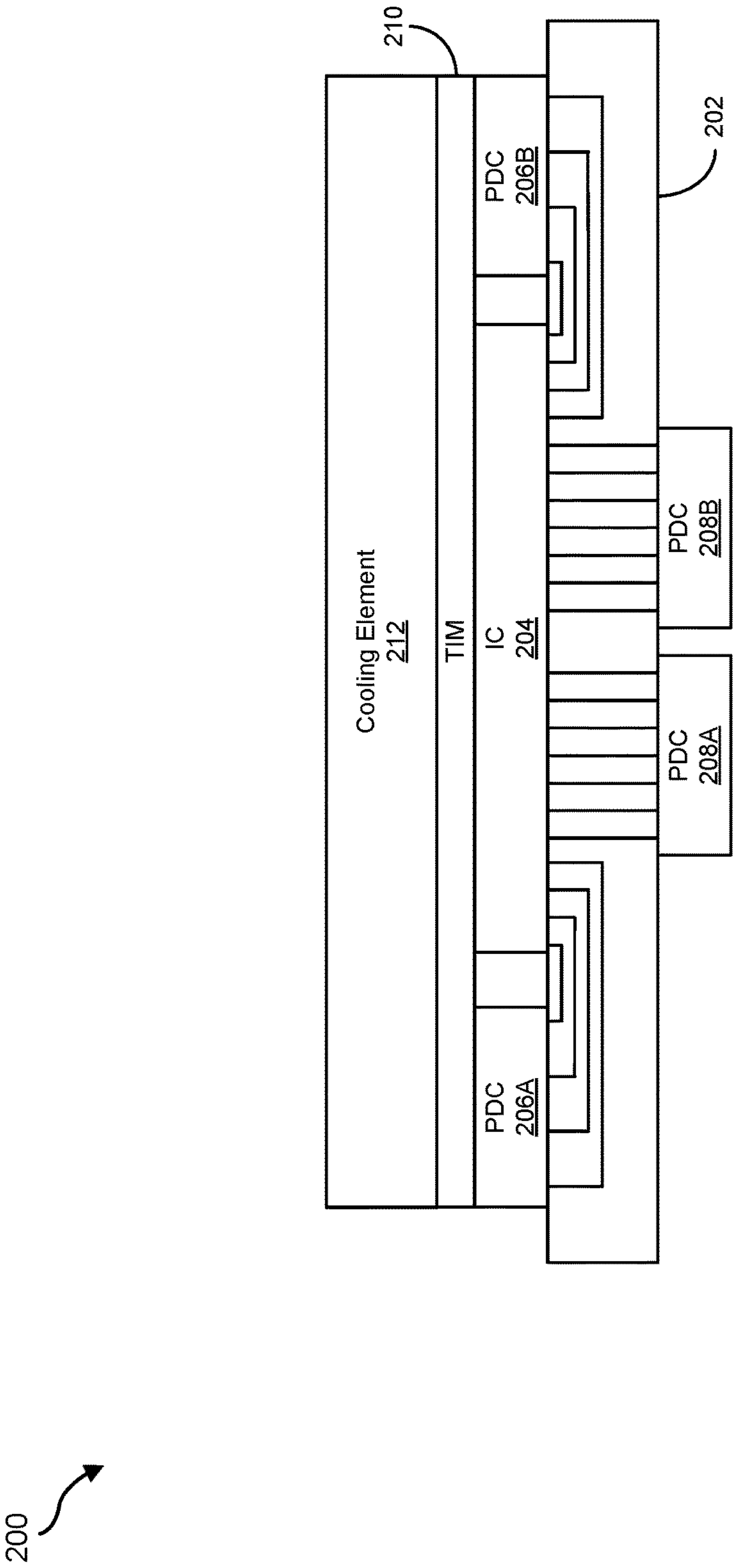
FIG. 2 is a block diagram illustrating an example expansion card having back side power delivery components.

FIG. 2 illustrates an example expansion card 200 having back side power delivery components (PDCs) 208A and 208B (e.g., voltage regulators) and a front side cooling system. A PCB 202 has an integrated circuit (IC) 204 (e.g., ASIC) on a front (e.g., top) side along with front side power delivery components (PDCs) 206A and 206B (e.g., voltage regulators) located adjacent to (e.g., on one or more sides of) the IC 204. The IC 204 and/or the front side PDCs 206A and 206B can be cooled by the front side cooling system that includes the cooling element 212 (e.g., cold plate and/or heat pipe) and thermal interface material 210 located between the cooling element 212 and the IC 204 and/or PDCs 206A and 206B. The back side PDCs 208A and 208B are located on a back (e.g., bottom) side of the PCB 202 beneath the IC 204, and a power delivery path can extend into the PCB 202 (e.g., silicon) and extend between the IC 204 and the PDCs 206A, 206B, 208A, and 208B. Due to the location of the back side PDCs 208A and 208B, the power delivery path that extends between the IC 204 and the back side PDCs 208A and 208B can be shorter than the power delivery path that extends between the IC 204 and the front side PDCs 206A and 206B.

The shorter power delivery path that extends between the IC 204 and the back side PDCs 208A and 208B yield numerous benefits. For example, the shorter path results in reduced PCB copper planes and a reduced number of layers for reduced PCB cost. Additionally, the shorter path results in reduced power path resistance between the PDCs 208A and 208B and the IC 204 for reduced PCB copper losses. Also, the shorter path results in reduced PDN impedance from the PDCs 208A and 208B to the IC 204. Further, the shorter path results in reduced PDN noise and increased conversion efficiency for increased useful throughput power. In some examples, the PDCs 206A, 206B, 208A, and 208B can, in combination, provide a combined power delivery of at least fourteen-hundred watts.

A challenge in implementing the expansion card 200 having the features described above arises in cooling the back side PDCs 208A and 208B. Complying with OAM standards can entail achieving this goal while fitting within an amount of available clearance (e.g., eight millimeters) beneath the PCB 202 in conformance with OAM form factor requirements, especially where the PDCs 208A and 208B already consume approximately three millimeters of the available clearance.

Figure 3:
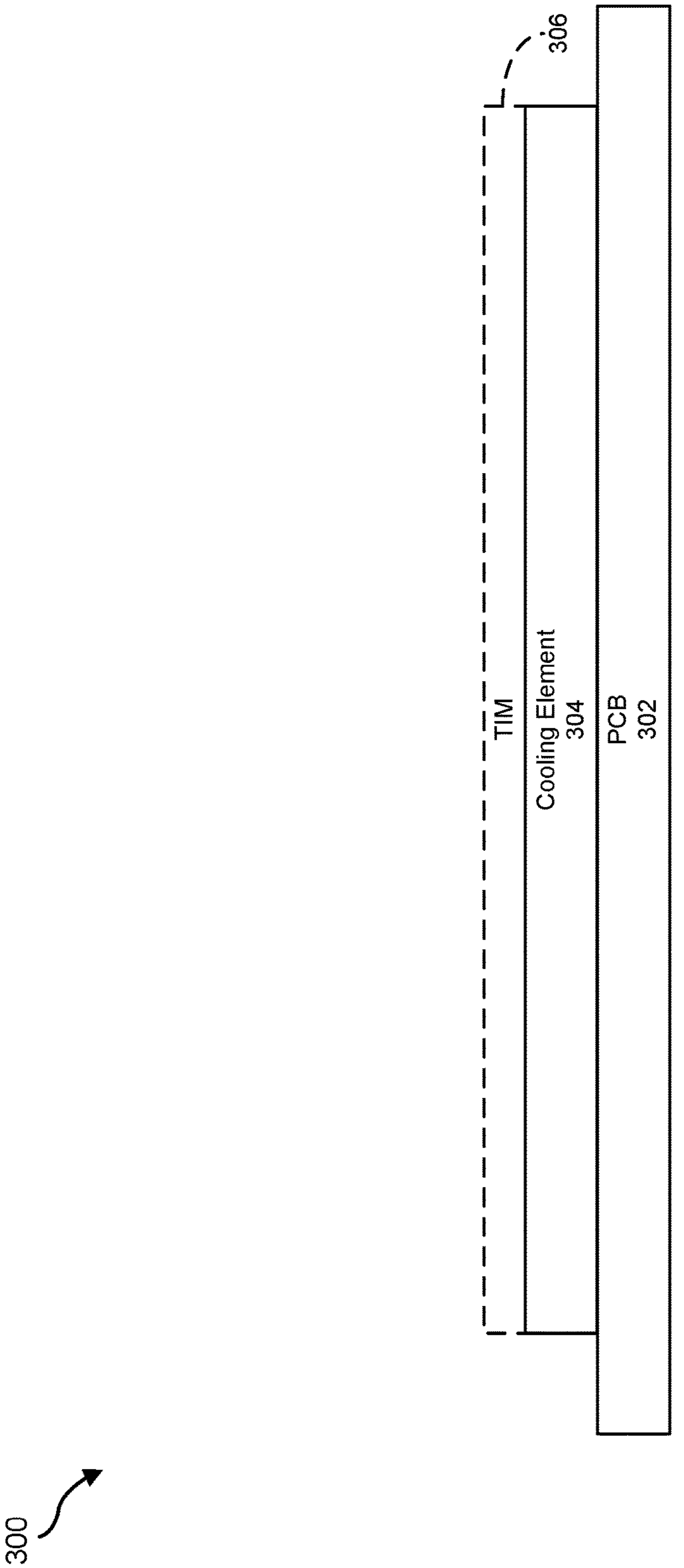
FIG. 3 is a block diagram illustrating an example apparatus for server level cooling.

FIG. 3 illustrates an example system 300 for server level cooling. System 300 can be configured to cool more than one expansion card. For example, system 300 can include a PCB 302 having an attached cooling system that includes a cooling element 304. In some examples, the PCB 302 can be configured as a UBB (e.g., of a server) and the cooling element can be directly (e.g., permanently, persistently, etc.) attached to the UBB (e.g., by adhesive, screws, bolts, brackets, or any other retention device(s)). Additionally or alternatively, cooling element 304 can be a cold plate having a thickness no greater than half of an amount (e.g., four millimeters) of available clearance (e.g., eight millimeters) beneath a PCB of the expansion card in conformance with OAM form factor requirements. In some implementations, back side thermal interface material 306 can be attached to the cooling element (e.g., by adhesive). Alternatively, back side thermal interface material 306 can be provided separately.

Figure 4:
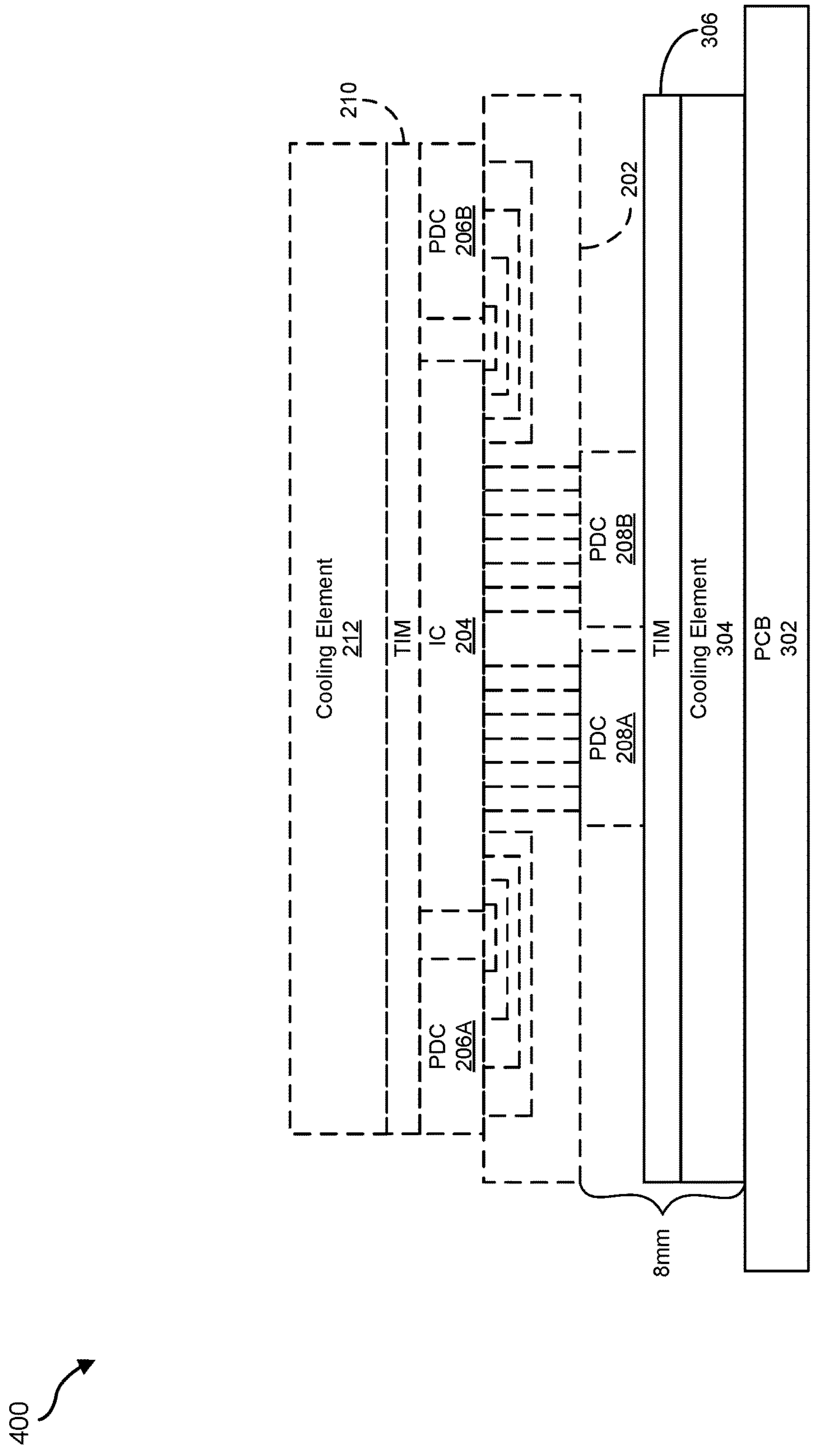
FIG. 4 is a block diagram illustrating an example apparatus for server level cooling.

FIG. 4 illustrates an example system 400 for server level cooling. System 400 can be configured to cool more than one expansion card, such as expansion card 200 having PCB 202, IC 204, front side PDCs 206A and 206B, back side PDCs 208A and 208B, thermal interface material 210, and cooling element 212. For example, the system 400 can include PCB 302 having an attached cooling system that includes a cooling element 304. In some examples, the PCB 302 can be configured as a UBB (e.g., of a server) and the cooling element can be directly (e.g., permanently, persistently, etc.) attached to the UBB (e.g., by adhesive, screws, bolts, brackets, or any other retention device(s)). Additionally or alternatively, cooling element 304 can be a cold plate having a thickness no greater than half of an amount (e.g., four millimeters) of available clearance (e.g., eight millimeters) beneath the PCB 302 in conformance with OAM form factor requirements. This cooling element thickness can facilitate a combined thickness of the back side cooling system, the back side power delivery components 208A and 208B, and back side thermal interface material 306 being no greater than the amount of available clearance (e.g., eight millimeters) beneath the PCB 202 in conformance with OAM form factor requirements. In some implementations, back side thermal interface material 306 can be attached to the cooling element (e.g., by adhesive). Alternatively, back side thermal interface material 306 can be provided separately (e.g., sold separately from systems 300 and/or 400, added by a customer, replaced by an end user, etc.). Back side thermal interface material 306 can be held in place between cooling element 304 and back side PDCs 208A and 208B of an expansion card (e.g., by friction fit).

Cooling element 304 can extend beyond one or more dimensions (e.g., length and/or width) of an expansion card and be large enough in area for placement thereon of two or more (e.g., two, four, or eight) expansion cards. In some implementations, back side thermal interface material 306 can be sized and shaped for positioning between the cooling element 304 and the back side PDCs 208A and 208B of more than one expansion card. Alternatively, cooling element 304 can be provided with more than one piece of back side thermal interface material 306, and at least one of the pieces of back side thermal interface material 306 can be sized and shaped for positioning between the cooling element 304 and back side PDCs 208A and 208B of only one expansion card. Multiple pieces of back side thermal interface materials 306 (e.g., one per expansion card) can facilitate replacement of a particular piece of back side thermal interface material 306 when replacing an expansion card, without having to remove any other expansion cards in the process.

Figure 5:
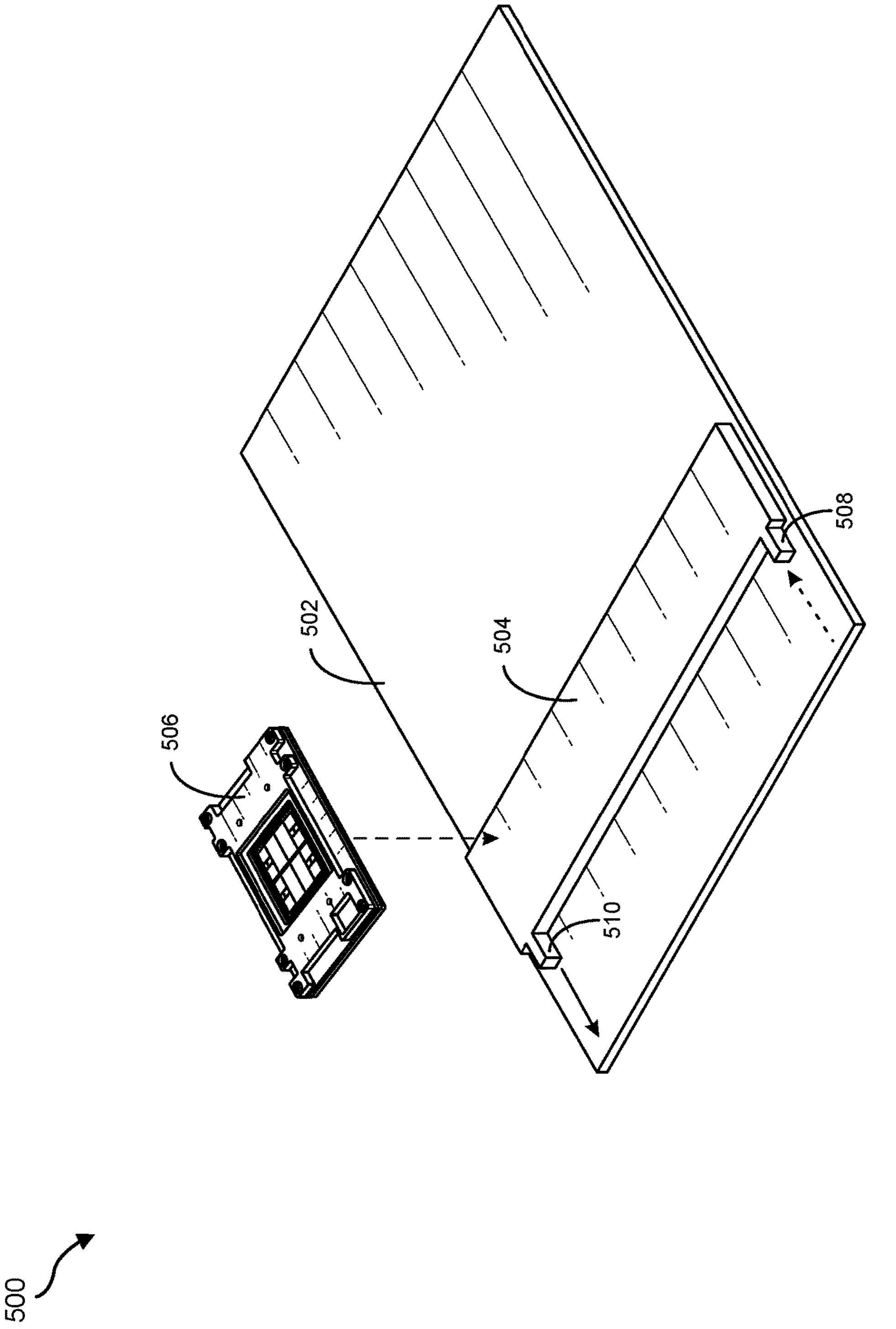
FIG. 5 is a perspective view of an example apparatus for server level cooling.

FIG. 5 illustrates an example apparatus 500 for server level cooling. Apparatus 500 can include one or more features in accordance with those previously described with reference to FIGS. 1-4. For example, apparatus 500 can include a PCB configured as a UBB 502 having a back side cooling system that includes a back side cooling element 504 (e.g., cold plate, fins, etc.) directly attached to the UBB 502. The back side cooling system can have one or more dimensions (e.g., length and/or width) allowing placement (e.g., side by side) of multiple (e.g., four) expansion cards 506 on the back side cooling element 504. One or more pieces of thermal interface material can be attached to a front side of the back side cooling element 504, attached to a back side of individual expansion cards 506, and/or provided separately and positioned between the back side cooling element 504 and the one or more expansion cards 506. In some examples, back side cooling element 504 can correspond to a cold plate having a fluid inlet 508, a fluid outlet 510, and one or more fluid routing components.

The back side cooling system including back side cooling element 504 can be operable independently of one or more front side cooling systems located on front sides of individual expansion cards 506. For example, temperature and/or flow rate of a fluid deliverable through the back side cooling element 504 can be controllable independently of an additional temperature and/or an additional flow rate of an additional fluid deliverable through a front side cooling element of the front side cooling system. In some examples, the front side cooling systems of the individual expansion cards 506 can further be operable independently of one another. Due to independent operation of the back side cooling system and the front side cooling systems, there is no need for fluid routing components between the front side and back side cooling systems. As a result, individual expansion cards 506 can be replaced without any need to modify the back side cooling system. Additionally, the independent operation and can allow for a larger area of the back side cooling element 504 and greater volume of fluid compared to individual back side cooling systems, thus providing more effective cooling that facilitates increased total power delivery (e.g., at least fourteen hundred watts) to one or more expansion cards 506.

In some implementations and as set forth above, apparatus 500 can be configured as a shared server level 4P cooling system that enables highly integrated power delivery components to be placed on the back side of an accelerator card, underneath the processor, and can enable total board power of at least fourteen hundred watts. This cooling solution can be directly attached to the UBB, thereby improving fluid routing and serviceability by allowing easy replacement of accelerators in service. The highly integrated nature of this solution allows for increased power density and meeting the power delivery requirements of high-performance accelerators.

The above described server level implementation can achieve independent fluid circuits for the bottom and top cooling solutions. The independent fluid circuits can allow independent control of the back side cooling system by controlling the flow rate and/or temperature and make it possible to increase power delivery. This implementation can also simplify the assembly of the UBB and drastically improve serviceability by allowing replacement of OAMs without having to modify the back side cooling system components. This 4P cooling system can also reduce the cost of the thermal solution when compared to four individual cold plates for each OAM.

Figure 8:
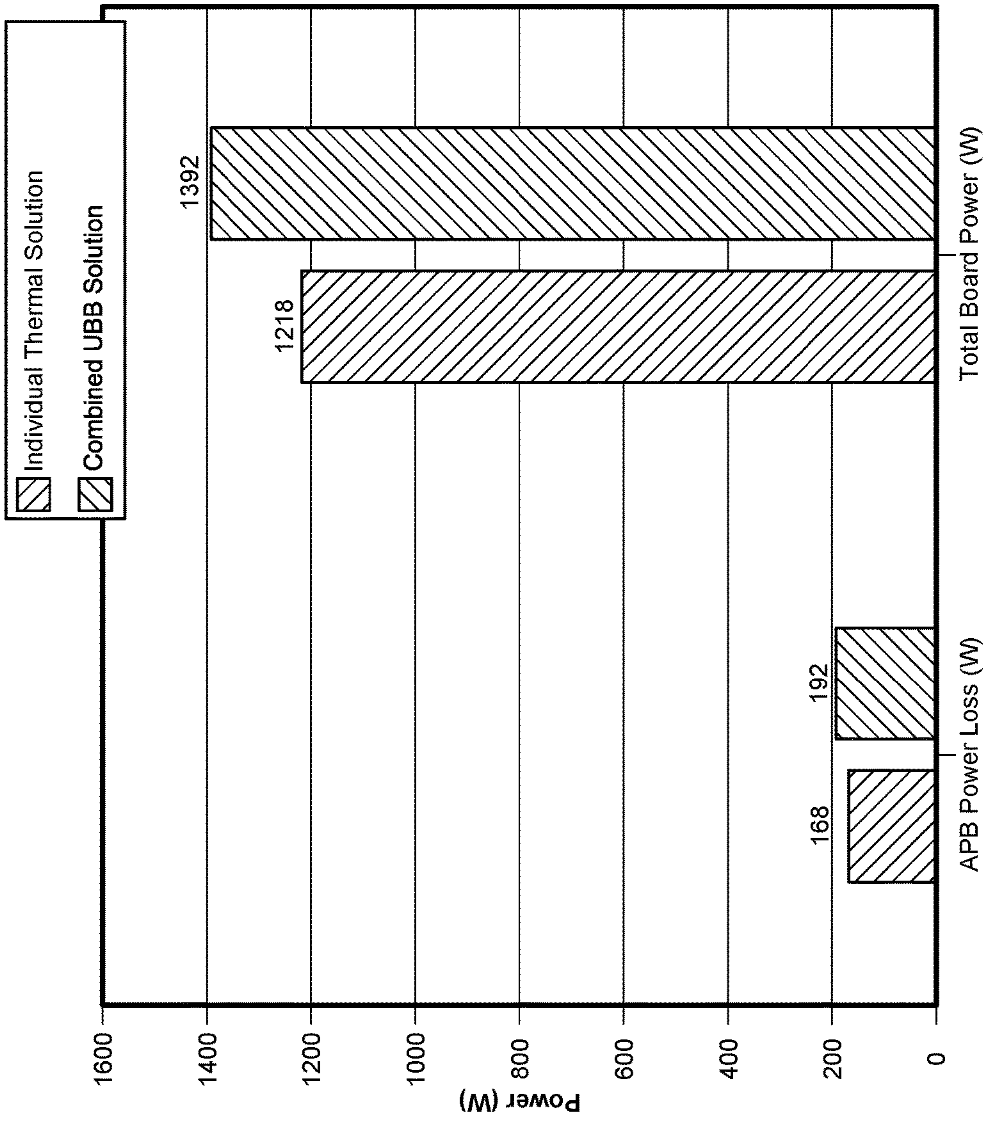
FIG. 8 is a graphical illustrating example power delivery with and without server level cooling.

In order to meet OAM form factor design specifications, the back side cooling system can use a liquid-cooled cold plate having a thickness no greater than half of an amount (e.g., four millimeters) of available clearance (e.g., eight millimeters) beneath PCBs of individual expansion cards 506 in conformance with OAM form factor requirements. The cold plate can include cooling channels, pin fins, serpentine channels, and/or other heat transfer enhancement structures. The back side cooling system can be directly attached to the UBB 502 and a thermal interface material can be used to make contact with the power components. As shown in FIG. 8 at 800, preliminary results indicate that this solution can support more than 10% (e.g., approximately 14%) additional total board power (e.g., at least fourteen hundred watts), compared to individual back side cold plates, while improving serviceability.

Figure 6:
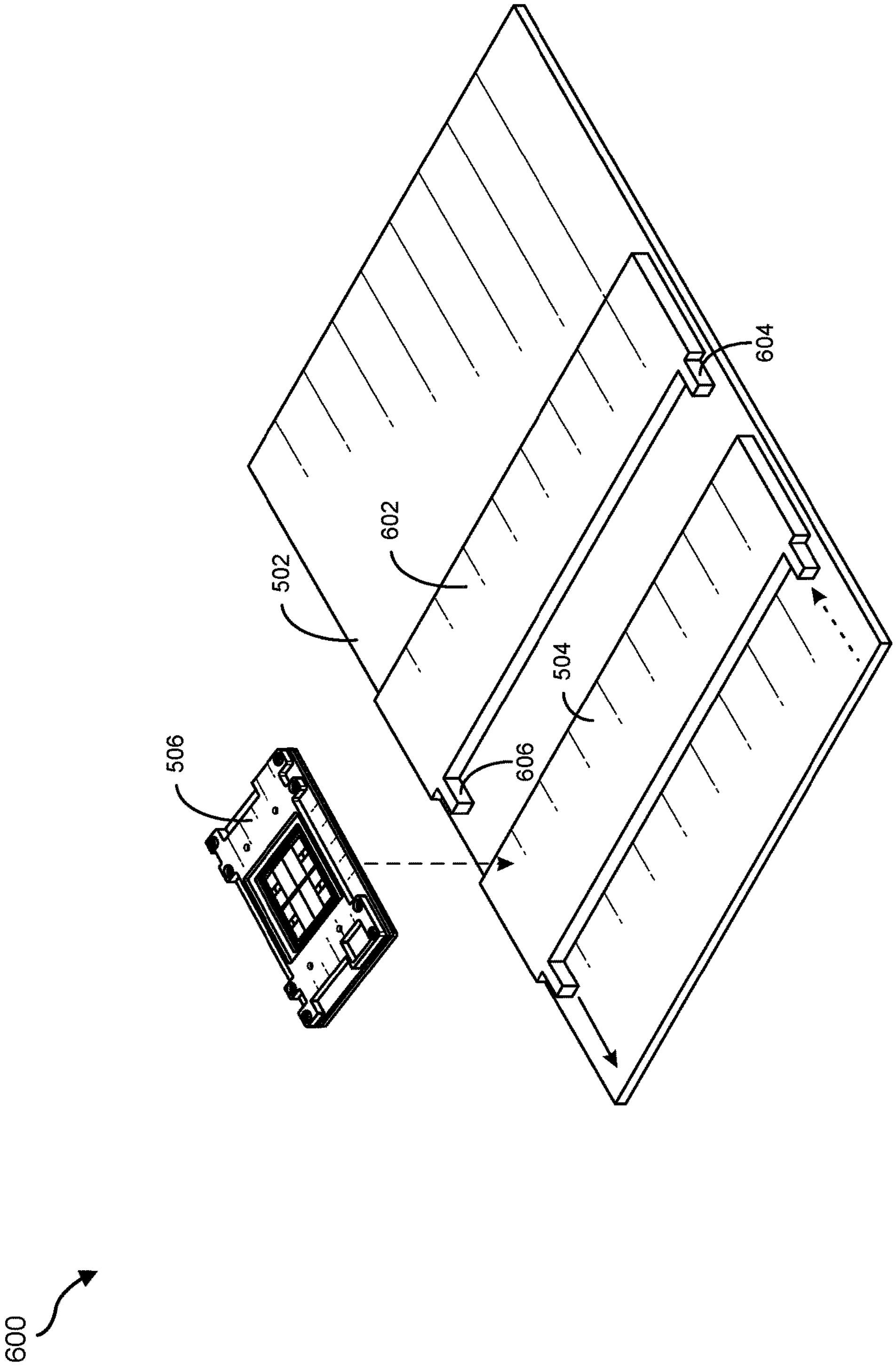
FIG. 6 is a perspective view of an example apparatus for server level cooling.

FIG. 6 illustrates an example apparatus 600 for server level cooling. Apparatus 600 can include one or more features in accordance with those previously described with reference to FIGS. 1-5, such as UBB 502 and back side cooling element 504 allowing placement (e.g., side by side) of multiple (e.g., four) expansion cards 506 thereon. Additionally, apparatus 600 can include an additional back side cooling system that includes an additional back side cooling element 602 (e.g., cold plate, fins, etc.) directly attached to the UBB 502. The additional back side cooling system can have one or more dimensions (e.g., length and/or width) allowing placement (e.g., side by side) of multiple (e.g., four) expansion cards 506 on the additional back side cooling element 602. One or more pieces of thermal interface material can be attached to a front side of the additional back side cooling element 602, attached to a back side of individual expansion cards 506, and/or provided separately and positioned between the additional back side cooling element 602 and the one or more expansion cards 506. In some examples, additional back side cooling element 602 can correspond to a cold plate having a fluid inlet 604, a fluid outlet 606, and one or more fluid routing components. In some implementations, additional back side cooling element 602 can be operable independently of back side cooling element 504.

The additional back side cooling system including additional back side cooling element 602 can be operable independently of one or more front side cooling systems located on front sides of individual expansion cards 506. For example, temperature and/or flow rate of a fluid deliverable through the additional back side cooling element 602 can be controllable independently of an additional temperature and/or an additional flow rate of an additional fluid deliverable through an additional cooling element of the front side cooling system. In some examples, the front side cooling systems of the individual expansion cards 506 can further be operable independently of one another. Due to independent operation of the additional back side cooling system and the front side cooling systems, there is no need for fluid routing components between the front side and additional back side cooling systems. As a result, individual expansion cards 506 can be replaced without any need to modify the additional back side cooling system. Additionally, the independent operation can allow for a larger area of the additional back side cooling element 602 and greater volume of fluid compared to the front side cooling systems, thus providing more effective cooling that facilitates increased total power delivery (e.g., at least fourteen hundred watts) to one or more expansion cards 506.

In some implementations and as set forth above, apparatus 600 can be configured as a shared server level 8P cooling system that enables highly integrated power delivery components to be placed on the back side of an accelerator card, underneath the processor, and can enable increased total board power. This cooling solution can be directly attached to the UBB, thereby improving fluid routing and serviceability by allowing easy replacement of accelerators in service. The highly integrated nature of this solution allows for increased power density and meeting the power delivery requirements of high-performance accelerators. Back side cooling elements 504 and 602 can also both be liquid-cooled cold plates having thicknesses no greater than half an amount (e.g., four millimeters) of available clearance (e.g., eight millimeters) beneath PCBs of individual expansion cards 506 in conformance with OAM form factor requirements and an independent fluid circuit. This cooling element thickness and fluid circuit independence can facilitate independent control of cooling systems that meet OAM form factor design specifications.

Figure 7:
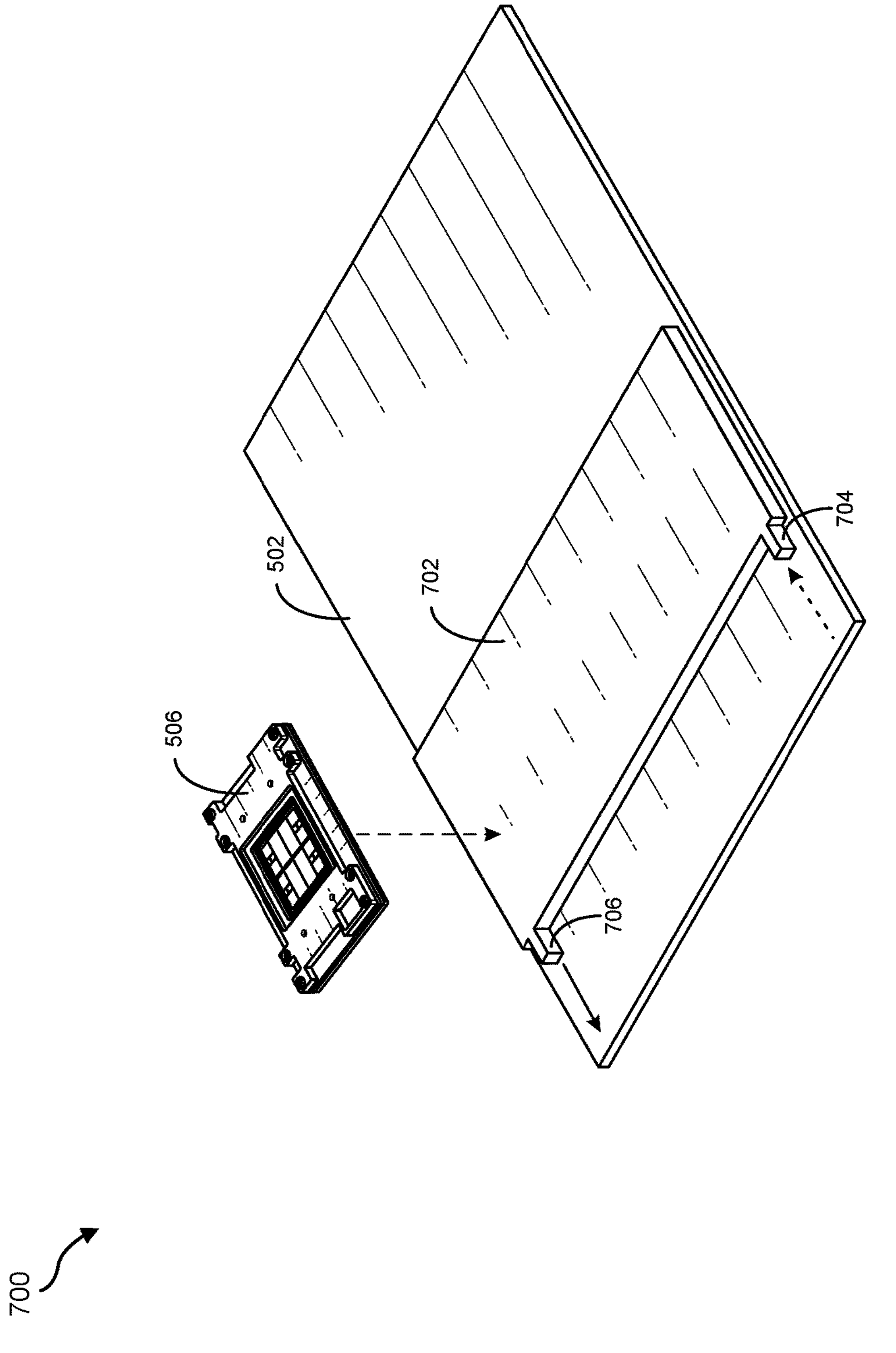
FIG. 7 is a perspective view of an example apparatus for server level cooling.

FIG. 7 illustrates an example apparatus 700 for server level cooling. Apparatus 700 can include one or more features in accordance with those previously described with reference to FIGS. 1-6, such as UBB 502. Apparatus 700 can include a back side cooling element 702 allowing placement (e.g., side by side, in two or more rows, etc.) of multiple (e.g., eight) expansion cards 506 thereon. Like back side cooling element 504 of FIG. 5, back side cooling element 702 (e.g., cold plate, fins, etc.) can be directly attached to the UBB 502. The back side cooling element 702 can have one or more dimensions (e.g., length and/or width) allowing placement (e.g., side by side, in two or more rows, etc.) of multiple (e.g., eight) expansion cards 506 on the back side cooling element 702. One or more pieces of thermal interface material can be attached to a front side of the back side cooling element 702, attached to a back side of individual expansion cards 506, and/or provided separately and positioned between the back side cooling element 702 and the one or more expansion cards 506. In some examples, back side cooling element 702 can correspond to a cold plate having a fluid inlet 704, a fluid outlet 706, and one or more fluid routing components.

The back side cooling system including back side cooling element 702 can be operable independently of one or more front side cooling systems located on front sides of individual expansion cards 506. For example, temperature and/or flow rate of a fluid deliverable through the back side cooling element 702 can be controllable independently of an additional temperature and/or an additional flow rate of an additional fluid deliverable through a front side cooling element of the front side cooling system. In some examples, the front side cooling systems of the individual expansion cards 506 can further be operable independently of one another. Due to independent operation of the back side cooling system and the front side cooling systems, there is no need for fluid routing components between the front side and back side cooling systems. As a result, individual expansion cards 506 can be replaced without any need to modify the back side cooling system. Additionally, the independent operation can allow for a larger area of the back side cooling element 702 and greater volume of fluid compared to the front side cooling systems, thus providing more effective cooling that facilitates increased total power delivery (e.g., at least fourteen hundred watts) to one or more expansion cards 506.

In some implementations and as set forth above, apparatus 700 can be configured as a shared server level 8P cooling system that enables highly integrated power delivery components to be placed on the back side of an accelerator card, underneath the processor, and can enable increased total board power. This cooling solution can be directly attached to the UBB, thereby improving fluid routing and serviceability by allowing easy replacement of accelerators in service. The highly integrated nature of this solution allows for increased power density and meeting the power delivery requirements of high-performance accelerators. Back side cooling element 702 can also be a liquid-cooled cold plate having a thickness no greater than half an amount (e.g., four millimeters) of available clearance (e.g., eight millimeters) beneath PCBs of individual expansion cards 506 in conformance with OAM form factor requirements and an independent fluid circuit. This cooling element thickness and fluid circuit independence facilitates independent control of a back side cooling system that meets OAM form factor design specifications.

As set forth above, the disclosed systems and methods can provide a shared server level cooling mechanism that enables highly integrated power delivery components to be placed on the back side of the accelerator card, underneath the processor, and can enable increased total board power (e.g., at least fourteen hundred watts). The cooling system can be directly attached to a server's printed circuit board (PCB) (e.g., Universal Base Board (UBB)), thereby improving fluid routing and serviceability by allowing easy replacement of accelerators in service. The highly integrated nature of this cooling system can also allow for increased power density and meeting of the power delivery requirements of high-performance accelerators.

The disclosed systems and methods can achieve numerous benefits. For example, the disclosed systems and methods can enable power delivery of at least fourteen hundred watts in an OAM form factor, which represents the highest power density in the industry and corresponds to delivery of more than two-thousand five-hundred amps. In other examples, the disclosed systems and methods can also achieve a lower cost thermal solution and/or ease of assembly and serviceability in operation. In still other examples, the disclosed systems and methods can further achieve reduced PCB copper planes and numbers of layers that can yield a lower PCB cost for the expansion cards, reduced power path resistance between voltage regulators and processors, lower PCB copper losses, increased conversion efficiency, increased useful throughput power, reduced PDN impedance between voltage regulators and processors, and/or lower PDN noise.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

In some examples, all or a portion of example system 100 in FIG. 1 can represent portions of a cloud-computing or network-based environment. Cloud-computing environments can provide various services and applications via the Internet. These cloud-based services (e.g., software as a service, platform as a service, infrastructure as a service, etc.) can be accessible through a web browser or other remote interface. Various functions described herein can be provided through a remote desktop environment or any other cloud-based computing environment.

In various implementations, all or a portion of example system 100 in FIG. 1 can facilitate multi-tenancy within a cloud-based computing environment. In other words, the modules described herein can configure a computing system (e.g., a server) to facilitate multi-tenancy for one or more of the functions described herein. For example, one or more of the modules described herein can program a server to enable two or more clients (e.g., customers) to share an application that is running on the server. A server programmed in this manner can share an application, operating system, processing system, and/or storage system among multiple customers (i.e., tenants). One or more of the modules described herein can also partition data and/or configuration information of a multi-tenant application for each customer such that one customer cannot access data and/or configuration information of another customer.

According to various implementations, all or a portion of example system 100 in FIG. 1 can be implemented within a virtual environment. For example, the modules and/or data described herein can reside and/or execute within a virtual machine. As used herein, the term "virtual machine" generally refers to any operating system environment that is abstracted from computing hardware by a virtual machine manager (e.g., a hypervisor).

In some examples, all or a portion of example system 100 in FIG. 1 can represent portions of a mobile computing environment. Mobile computing environments can be implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments can have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein can be provided for a mobile computing environment and/or can interact with a mobile computing environment.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus, comprising:

a first printed circuit board configured to support two or more expansion cards; and a first cooling element directly attached to the first printed circuit board, wherein:

the first cooling element has a surface sized for placement thereon of the two or more expansion cards in a side by side arrangement, the two or more expansion cards each having a second printed circuit board with one or more back side power delivery components situated thereon, each of the one or more back side power delivery components on a side of the second printed circuit board facing the first cooling element; and the first cooling element is configured to provide cooling to each of the one or more back side power delivery components of the two or more expansion cards placed thereon.

2. The apparatus of claim 1, further comprising a thermal interface material (TIM) positioned on the first cooling element, wherein a combined thickness of the first cooling element and the TIM is no greater than four millimeters.

3. The apparatus of claim 1, wherein the first cooling element has a thickness of no more than half of an amount of available clearance between the first printed circuit board and any of the second printed circuit board when one of the two or more expansion cards is placed on the first cooling element.

4. The apparatus of claim 1, wherein a combined thickness of the first cooling element, any of the one or more back side power delivery components on a back side of any of the two or more expansion cards, and a thermal interface material positioned between the first cooling element and any of the one or more back side power delivery components is no greater than an amount of available clearance between the first printed circuit board and any of the second printed circuit board when any of the two or more expansion cards is placed on the first cooling element.

5. The apparatus of claim 1, wherein the first cooling element is operable independently of an additional cooling system located on a front side of any of the two or more expansion cards placed thereon.

6. The apparatus of claim 5, wherein a temperature of a fluid deliverable through the first cooling element is controllable independently of an additional temperature of an additional fluid deliverable through an additional cooling element of the additional cooling system.

7. The apparatus of claim 5, wherein a flow rate of a fluid deliverable through the first cooling element is controllable independently of an additional flow rate of an additional fluid deliverable through an additional cooling element of the additional cooling system.

8. The apparatus of claim 1, wherein the first cooling element is configured to facilitate swappable replacement of each of the two or more expansion cards without requiring modification of the first cooling element.

9. The apparatus of claim 1, wherein the first cooling element has at least one fluid inlet, at least one fluid outlet, and at least one fluid routing component.

10. The apparatus of claim 9, wherein the at least one fluid routing component includes at least one of:

one or more cooling channels; one or more pin fins;

one or more serpentine channels; or one or more heat transfer enhancement structures.

11. The apparatus of claim 1, wherein a combined power delivery of front side power delivery components and the one or more back side power delivery components of an individual expansion card of the two or more expansion cards is at least fourteen-hundred watts.

12. The apparatus of claim 1, wherein the first printed circuit board is configured as a universal base board.

13. The apparatus of claim 1, wherein the surface of the first cooling element is greater in a length and/or a width than each individual expansion card of the two or more expansion cards and the surface is sized in the length and/or the width for placement of all of the two or more expansion cards thereon.

14. The apparatus of claim 1, further comprising:

the first printed circuit board is a universal base board of a server; and a second cooling element attached to the second printed circuit board;

wherein the first cooling element is larger than the second cooling element; and wherein the first cooling element operates independently of the second cooling element.

15. The apparatus of claim 1, wherein the surface of the first cooling element extends continuously beneath all of the two or more expansion cards when the two or more expansion cards are placed in the side by side arrangement.

16. A system, comprising:

a universal base board configured to support two or more expansion cards;

a cooling element directly attached to the universal base board; and the two or more expansion cards each having a printed circuit board with one or more back side power delivery components on a face of the printed circuit board facing the cooling element, the two or more expansion cards placed on a surface of the cooling element in a side by side arrangement with a thermal interface material positioned between the cooling element and each of the one or more back side power delivery components, wherein the cooling element is configured to provide cooling to each of the one or more back side power delivery components.

17. The system of claim 16, wherein a combined thickness of the cooling element, any of the one or more back side power delivery components, and the thermal interface material is no greater than an amount of available clearance between the universal base board and the printed circuit board of any of the two or more expansion cards when any of the two or more expansion cards is placed on the universal base board.

18. The system of claim 16, wherein a combined power delivery of front side power delivery components and the one or more back side power delivery components and of an individual expansion card of the two or more expansion cards is at least fourteen-hundred watts.

19. A method comprising:

providing a first printed circuit board configured to support two or more expansion cards;

providing the two or more expansion cards each having a second printed circuit board with one or more back side power delivery components on a face of the second printed circuit board facing the first printed circuit board;

attaching a cooling element directly to the first printed circuit board, wherein the cooling element has a surface configured to provide cooling to the one or more back side power delivery components of any of the two or more expansion cards placed thereon; and placing the two or more expansion cards in a side by side arrangement on the surface of the cooling element.

20. The method of claim 19, wherein the cooling element is configured to facilitate swappable replacement of each of the two or more expansion cards without requiring modification of the cooling element.

* * * * *